US005635788A

United States Patent [19]

Soltermann et al.

[11] Patent Number: 5,635,788

[45] Date of Patent: Jun. 3, 1997

[54] CONTROL CIRCUIT FOR A PIEZOELECTRIC VIBRATOR

[75] Inventors: Bertrand Soltermann, Chavannes; Saji Jabbour, Rances, both of Switzerland

[73] Assignee: SMH Management Services AG, Biel, Switzerland

[21] Appl. No.: 553,898

[22] Filed: Nov. 6, 1995

[30] Foreign Application Priority Data

Nov. 8, 1994 [CH] Switzerland ........................ 03 333/94

[51] Int. Cl.[6] .................................................. H01L 41/107

[52] U.S. Cl. .................................................. 310/317

[58] Field of Search ..................................... 310/317, 319

[56] References Cited

U.S. PATENT DOCUMENTS

| | | | |
|---|---|---|---|
| 4,232,241 | 11/1980 | Hamatani | 310/317 |
| 4,258,282 | 3/1981 | Rijckaert | 310/317 |
| 4,259,605 | 3/1981 | Rijckaert | 310/317 |
| 4,714,935 | 12/1987 | Yamamoto et al. | 310/317 |

FOREIGN PATENT DOCUMENTS

| | | | |
|---|---|---|---|
| 2279254 | 2/1976 | France | H03B 11/10 |
| 3230218 | 2/1984 | Germany | G04G 13/02 |

OTHER PUBLICATIONS

Patent Abstracts of Japan, vol. 14, No. 28, Jan. 19, 1990 & JP–A–01 264575 (Toyota Motor Corp) Oct. 20, 1989.

*Primary Examiner*—Thomas M. Dougherty
*Attorney, Agent, or Firm*—Sughrue, Mion, Zinn, Macpeak & Seas

[57] ABSTRACT

The control circuit of the piezoelectric vibrator comprises two branches, each comprising switching means (T1, T2) arranged to go into a blocking state and a conducting state following the reception of a control signal, and a series connection of a coil (2,2') with a diode (3,3'), a first terminal (A,A') of said series connection being connected to a voltage supply source (1) and a second terminal (B,B') of said connection being connected to said switching means (T1, T2).

The vibrator (4) is connected between said second terminals (B,B') so as to be excited in alternance in a first direction, when said first switching means are in the blocking state and at the same time the second switching means are in the conducting state, and in a second direction, when said second switching means are in the blocking state while at the same time the first switching means are in the conducting state.

5 Claims, 1 Drawing Sheet

CONTROL CIRCUIT FOR A PIEZOELECTRIC VIBRATOR

The present invention concerns a control circuit for a piezoelectric vibrator. Such a vibrator is in particular intended to equip an electronic watch having an acoustic alarm device.

Control circuits for a piezoelectric vibrator are already known, for example from American Pat. No. US-A-4,232,241. This document describes such a circuit which comprises a branch comprising a coil and a diode connected in series, and a piezoelectric vibrator connected in parallel to the branch thus forming a parallel circuit. One side of this parallel circuit is connected to a voltage supply source, while the other side of this parallel circuit is connected to a transistor, which is itself also connected to the voltage supply source. While the transistor is conducting, a current flows through the branch and the transistor, and the coil stocks the corresponding electromagnetic energy. When the transistor is blocking, the current flows through the parallel circuit, and the voltage induced in the coil is thus applied to the terminals of the vibrator so as to excite the latter.

However, the sound level which may be obtained with such a circuit is limited, which is a disadvantage when using such a circuit for an acoustical alarm. In fact, the amount of energy which the coil may stock is a function of its volume, i.e. the number of windings and the diameter of the wire constituting the coil. As it is desirable to incorporate the control circuit in a watch for example, it will be understood that such a circuit may not be too large.

The aim of the present invention is to provide a solution to these problems by presenting a control circuit for a piezoelectric vibrator which is of a simple construction, which is not expensive, and which allows to obtain a very high sound level, without the dimensions of this circuit becoming too large, so that it may be incorporated into a watch for example.

This aim is obtained thanks to the specific features which presents the control circuit according to claim 1.

The solution described by the invention consists in feeding the piezoelectric vibrator by two voltage supply lines, each one comprising a coil. In this way, the vibrator can be held under tension continually and is excited in a maximum way. In fact, the vibrator is excited in both directions relative to its rest position and it thus has a displacement which is larger than the vibrator of the prior art. It will thus be understood that, even if the efficiency of the circuit is diminished, the sound level will be much higher relative to a circuit of the prior art.

Other features and advantages of the invention will appear more clearly when reading the following description with reference to the annexed drawings, which are solely given by way of example, and in which:

FIG. 1 represents schematically a control circuit of a piezoelectric vibrator according to the invention.

The circuit comprises a voltage supply source 1, having for example a voltage of three volts, and supplying two electrical branches. Each branch comprises a series connection of a coil 2, 2' and a diode 3, 3', this connection being connected by way of a first terminal A, A' to the high voltage supply level of voltage supply source 1. Of course, the position of coil 2 respectively 2' and diode 3 respectively 3', may be inversed. Each connection is further connected, by the intermediary of a second terminal B, B', to switching means, for example transistors T1, T2. Each transistor T1, T2 is connected by its emitter to the low voltage level of the voltage supply source 1 in such a way that a current may flow through each branch when a transistor is in its conducting, or on-state. Of course, here also, the position of the series connection and the transistor may be inversed. In this case, the common terminal of the transistors will be the one connected to the high voltage level instead of the terminal which is connected to the low voltage level of voltage supply source 1 in the given example. A piezoelectric vibrator 4 such as a piezoelectric membrane is connected between the two terminals B, B'.

Each transistor T1, T2 is controlled respectively by a periodic control signal S1 and S2 applied to its base. The signal S2 is dephased relative to signal S1, for example by 180°, so that when transistor T1 goes into conductance by a control signal S1, the other transistor T2 is held in its blocking or off-state by control signal S2.

The control signals S1 and S2 are for example pulse signals, of which each leading edge changes the state of transistor T1 and T2 respectively. When transistor T2 goes into conductance, transistor T1 goes into the blocking state, and an electric current flows through coil 2' and diode 3' from the continuous voltage supply source 1 thereby passing through transistor T2, coil 2' thus stocking the corresponding energy.

At the moment when transistor T1 goes into conductance thanks to its control signal S1, transistor T2 goes into the blocking state under the action of its control signal S2, dephased relative to signal S1. The induced voltage in coil 2' will thus be applied to the terminals of vibrator 4 to put it in excitation. On the other hand, a current flows through coil 2 and diode 3 from the continuous voltage supply source 1 passing through transistor T1, and coil 2 thus stores the corresponding energy.

Vibrator 4 is thus held under a continuous voltage by the induced voltage of either coil 2, or coil 2'. If the frequency of the changing of the voltage which is applied to vibrator 4 corresponds to the resonance frequency of the vibrator, the latter will be excited in a maximum manner.

Figure 1:
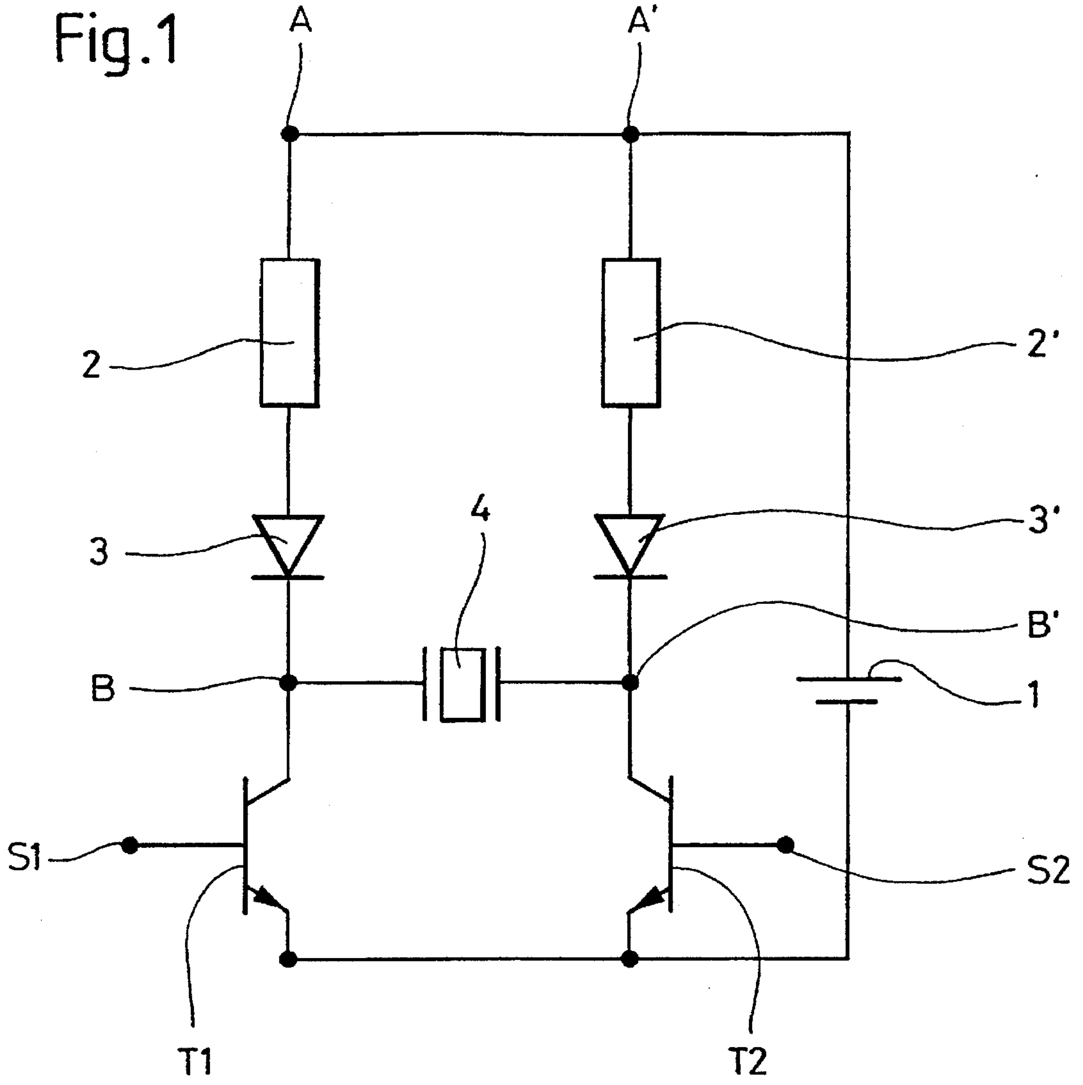
FIG. 1 represents schematically a control circuit for a piezoelectric vibrator according to the invention.
Figure 2:
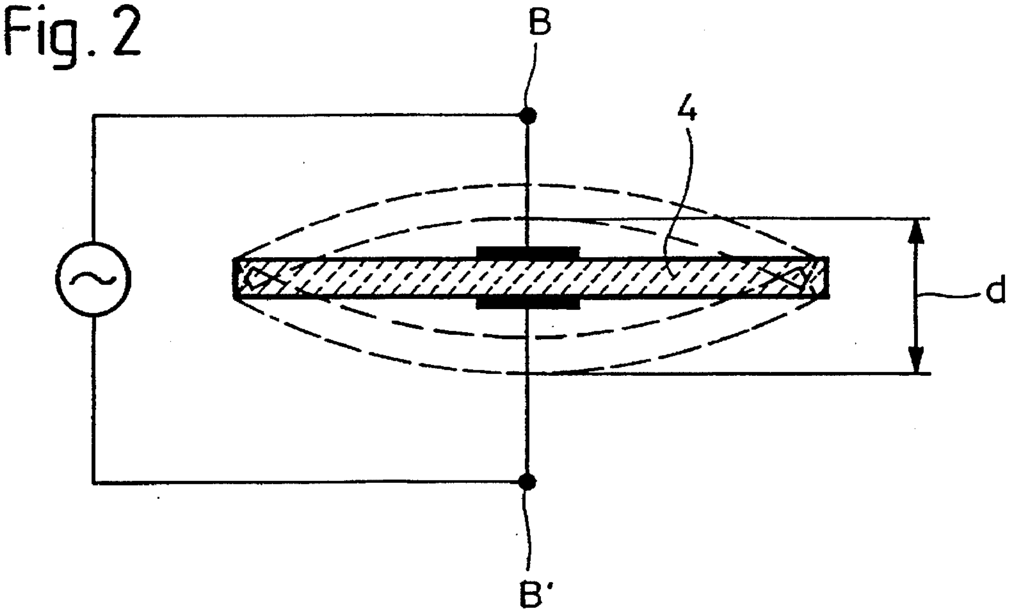
FIG. 2 represents schematically the excitation of the piezoelectric vibrator by the circuit of FIG. 1.

FIG. 2 represents schematically such an excitation of vibrator 4. The voltage applied by coil 2 excites vibrator 4 in a first direction relative to its rest position, for example, in an upper direction indicated by the dotted line in FIG. 2. The voltage applied by coil 2' will then excite vibrator 4 in the other direction, for example in a down direction as is also indicated in FIG. 2, at the moment of the changing of the states of transistors T1, T2 as has been explained hereabove. Vibrator 4 is thus driven in alternance and vibrates in both directions, in a way which is comparable to the membrane of a loudspeaker, and its displacement d is greater than if it were only excited in one direction.

Advantageously, the control circuit according to the invention allows to obtain a two-tone alarm, similar to a police alarm, by using control signals S1 and S2 which have slightly different frequencies. Of course, it is also possible to obtain a four-tone alarm with the circuit according to the invention by using a sweeping frequency for the control signals in a manner which is known to the skilled person.

As such, a circuit is obtained which may produce a sound level which is much higher than obtained by the circuit known from the prior art, without this circuit becoming much larger.

The control circuit according to the invention may also be advantageously used in a wristwatch having an alarm device. The circuit according to the invention may thus produce, with a watch battery, a sound level which is around 110 dB at 10 cm, this naturally also depending on the size of the piezoelectric vibrator and on the cavity in which it is placed.

What is claimed is:

1. A control circuit for a piezoelectric vibrator comprising:

a first branch comprising:

first switching means arranged to be put into its blocking and into its conducting state following the reception of a first periodic control signal, and a first series connection of a coil and a diode, a first terminal of said first series connection being connected to a voltage supply source and a second terminal of said first series connection being connected to said first switching means, wherein the control circuit further comprises a second branch comprising:

second switching means arranged to go into its blocking and into its conducting state following the reception of a second periodic control signal, and a second series connection of a coil and a diode, a first terminal of said second series connection being connected to said voltage supply source and a second terminal of said second series connection being connected to said second switching means, said vibrator being connected between said second terminals in such a way that when said first switching means are in the blocking state, said second switching are in the conducting state and are electrically connected in series with said vibrator and with said first series connection, while when said second switching means are in the blocking state, said first switching means are in the conducting state and are electrically connected in series with said vibrator and with said second series connection.

2. A circuit according to claim 1, wherein said switching means, each comprises a transistor each having a base to which one of said first and second control signals is applied and each having a path collector-emitter connected to said second terminals.

3. A circuit according to claim 1, wherein said second control signal is dephased by 180° with respect to said first control signal.

4. A circuit according to claim 2, wherein said second control signal is dephased by 180° with respect to said first control signal.

5. A watch having an acoustic alarm device comprising a piezoelectric vibrator, wherein said watch further comprises a control circuit for said piezoelectric vibrator, said control circuit comprising:

a first branch comprising:

first switching means arranged to be put into its blocking and into its conducting state following the reception of a first periodic control signal, and a first series connection of a coil and a diode, a first terminal of said first series connection being connected to a voltage supply source and a second terminal of said first series connection being connected to said first switching means, wherein the control circuit further comprises a second branch comprising:

second switching means arranged to go into its blocking and into its conducting state following the reception of a second periodic control signal, and a second series connection of a coil and a diode, a first terminal of said second series connection being connected to said voltage supply source and a second terminal of said second series connection being connected to said second switching means, said vibrator being connected between said second terminals in such a way that when said first switching means are in the blocking state, said second switching are in the conducting state and are electrically connected in series with said vibrator and with said first series connection, while when said second switching means are in the blocking state, said first switching means are in the conducting state and are electrically connected in series with said vibrator and with said second series connection.

* * * * *